US008380334B2

(12) United States Patent
Carroll

(10) Patent No.: US 8,380,334 B2
(45) Date of Patent: Feb. 19, 2013

(54) CARRYING AUXILIARY DATA WITHIN AUDIO SIGNALS

(75) Inventor: Tim J. Carroll, Lancaster, PA (US)

(73) Assignee: Linear Acoustic, Inc., Lancaster, PA (US)

( * ) Notice: Subject to any disclaimer, the term of this patent is extended or adjusted under 35 U.S.C. 154(b) by 255 days.

(21) Appl. No.: 12/876,289

(22) Filed: Sep. 7, 2010

(65) Prior Publication Data

US 2012/0059491 A1 Mar. 8, 2012

(51) Int. Cl.
*G06F 17/00* (2006.01)
*H03G 3/00* (2006.01)

(52) U.S. Cl. .......................................... 700/94; 381/104

(58) Field of Classification Search .................... 700/94; 381/104–109
See application file for complete search history.

(56) References Cited

U.S. PATENT DOCUMENTS

| | | | | |
|---|---|---|---|---|
| 5,612,943 | A * | 3/1997 | Moses et al. | 369/124.09 |
| 5,748,835 | A * | 5/1998 | Lee | 386/339 |
| 5,822,360 | A | 10/1998 | Lee et al. | |
| 6,594,373 | B1 * | 7/2003 | Gustafson | 382/100 |
| 6,661,923 | B1 | 12/2003 | Koike et al. | |
| 7,398,207 | B2 | 7/2008 | Riedl | |
| 7,496,418 | B2 | 2/2009 | Kim et al. | |
| 2002/0055796 | A1 | 5/2002 | Katayama et al. | |
| 2005/0220312 | A1 * | 10/2005 | Kasai et al. | 381/97 |
| 2008/0095385 | A1 | 4/2008 | Tourwe | |
| 2008/0221895 | A1 | 9/2008 | Pauws et al. | |
| 2008/0253586 | A1 | 10/2008 | Wei | |
| 2009/0046873 | A1 | 2/2009 | Riedl | |
| 2010/0114583 | A1 | 5/2010 | Lee et al. | |

FOREIGN PATENT DOCUMENTS

EP 1020998 7/2000

OTHER PUBLICATIONS

"ATSC Implementation Subcommittee Finding: PTS Time Stamping AC-3 Bit Streams", Advanced Television Systems Committee, 1750 K Street, Suite 1200, Washington DC 20006, Jan. 6, 2000.
Pauws, Steffen, "Musical Key Extraction from Audio", Philips Research Laboratories Eindhoven, Prof. Holstlaan 4, 5656 AA Eindhoven, the Netherlands, steffen.pauws@philips.com, 2004.
DP569 Dolby Digital Encoder Quick Start Guide Version 2.0.0.1, www.dolby.com, 2001.
International Search Report and Written Opinion of corresponding International Application No. PCT/US2011/050193, dated Feb. 17, 2011.
Karlheinz Brandenburg, "MP3 and AAC Explained," AES 17th International Conference on High Quality Audio Coding, Sep. 2-5, 1999, pp. 1-12.
"DTV and 'The Annoyingly Loud Commercial Problem'," http://www.tvtechnology.com/article/printableView.aspx?contentid=12644, Apr. 14, 2009, pp. 1-3.

* cited by examiner

*Primary Examiner* — Joseph Saunders, Jr.
(74) *Attorney, Agent, or Firm* — Renner, Otto, Boisselle & Sklar, LLP

(57) ABSTRACT

A system for inserting auxiliary data into an audio channel that carries an audio signal includes a modulator configured to convert an auxiliary data signal into a modulated auxiliary data signal that has a passband within the audio channel's passband. The system for inserting auxiliary data into an audio channel that carries an audio signal further includes summing means configured to combine the modulated auxiliary data signal and the audio signal into a combination signal to be carried in the audio channel.

20 Claims, 7 Drawing Sheets

CARRYING AUXILIARY DATA WITHIN AUDIO SIGNALS

FIELD OF THE INVENTION

The present disclosure relates to the transmission of audio signals. More particularly, the present disclosure relates to methods and systems for inserting auxiliary data within audio signals.

BACKGROUND

Modern distribution of audio signals to consumers involves the use of data rate reduction or audio compression techniques to lower the amount of data required to deliver these audio signals to consumers while causing minimal impact to the original audio quality. This reduction in the size of the data translates into a savings of transmission and storage bandwidth, thereby allowing cost savings or carriage of more programs in a given space. Systems including AC-3, DTS, MPEG-2 AAC, and High Efficiency AAC (HE AAC) are examples of common audio data reduction techniques Auxiliary data including metadata, also known as data about the audio data, is included in these systems to describe the encoded audio. Metadata is multiplexed with the compressed audio data and delivered to consumers where it is extracted and applied to the decoded audio in a sometimes user-adjustable manner to optimize reproduction for individual tastes or listening environments.

Metadata parameters such as dialnorm, program level, dynamic range control (DRC), and others are intended to control loudness and dynamic range, and are generated further upstream in the broadcast process, optimally in the production phase. Metadata has grown in importance as the arbiter of the balance between satisfying proposed loudness mitigation legislation such as the CALM Act and the artistic intent of program producers. Increased metadata reliability would allow satisfaction of existing and proposed legislation while keeping the original content protected and intact for those customers that have the ability and desire to experience it. As most of the signal processing prior to transmission occurs in the non-encoded pulse-code modulation (PCM) domain, carriage and storage of metadata, sometimes in a serial 115.2 kbps RS-485/422 format has conventionally been cumbersome and unreliable.

Professional systems such as Dolby E from Dolby Laboratories and e-squared from Linear Acoustic provide paths for metadata to be transmitted along side multiple channels of audio. However some of these systems suffered from the expense of being a separate process from the audio signal transmission process, and if not used correctly could exacerbate problems with audio/video synchronization (lip sync).

Newer standards such as SMPTE 2020 from the Society of Motion Picture and Television Engineers provide a relatively simple path for metadata to reside inside of the ancillary (VANC) space of serial digital video (SDI) signals, however not every device is capable of passing this VANC data, nor are most systems capable of recording or otherwise storing this data. New headers such as those proposed to work with the broadcast wave format (BWF) can also carry metadata information, however these have not yet been standardized or are not in broad use.

SUMMARY OF THE INVENTION

A system for inserting auxiliary data into an audio channel that carries an audio signal includes a modulator configured to convert an auxiliary data signal into a modulated auxiliary data signal that has a passband within the audio channel's passband. The system further includes summing means configured to combine the modulated auxiliary data signal and the audio signal into a combination signal to be carried in the audio channel.

A system for extracting auxiliary data from an audio channel that carries an audio signal includes a first filter configured to receive a combination signal including an audio signal and a modulated auxiliary data signal that has a passband within the audio channel's passband. The first filter is further configured to attenuate frequencies outside the modulated auxiliary data signal's passband to substantially obtain the modulated auxiliary data signal. The system further includes a demodulator configured to convert the modulated auxiliary data signal into an auxiliary data signal encoding the auxiliary data.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DEFINITIONS

Figure 1:
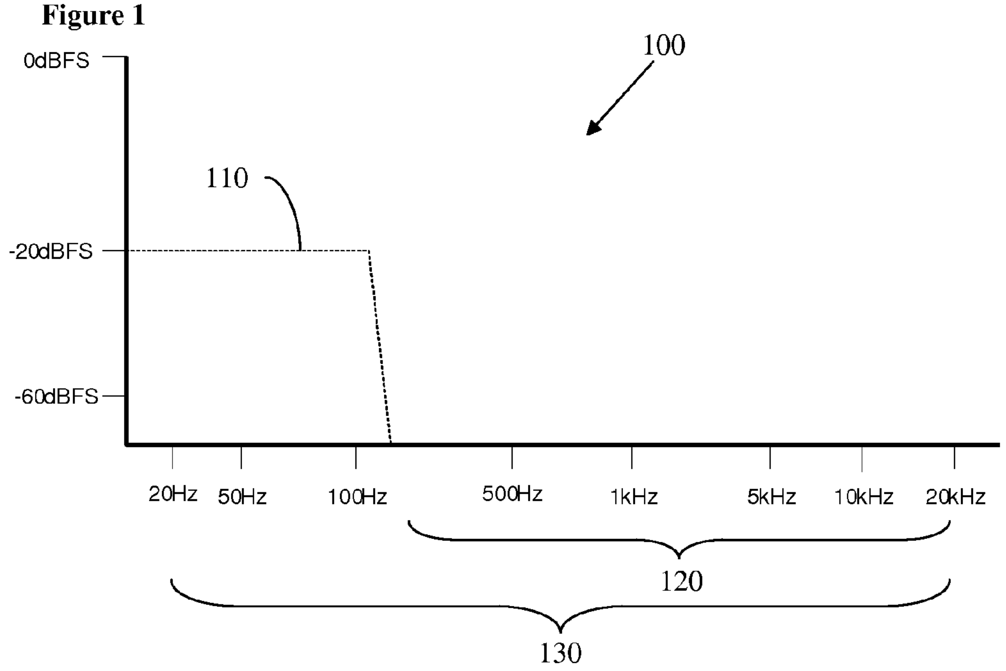
FIG. 1 illustrates a spectrum of a Low Frequency Effect (LFE) audio channel conducting an exemplary LFE audio signal prior to encoding.

The following includes definitions of selected terms employed herein. The definitions include various examples or forms of components that fall within the scope of a term and that may be used for implementation. The examples are not intended to be limiting. Both singular and plural forms of terms may be within the definitions.

"Bandwidth," as used herein, refers to the difference between the upper and lower cutoff frequencies of a communication channel or signal spectrum.

"Cutoff frequency," as used herein, refers to an edge frequency below or above which the power of a signal begins to attenuate rather than pass through (e.g., −3 dBFS of the signal's nominal passband value).

"Data store," as used herein, refers to a physical or logical entity that can store data. A data store may be, for example, a database, a table, a file, a list, a queue, a heap, a memory, a register, and so on. A data store may reside in one logical or physical entity or may be distributed between two or more logical or physical entities.

"Logic," as used herein, includes but is not limited to hardware, firmware, software or combinations of each to perform a function(s) or an action(s), or to cause a function or action from another logic, method, or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection," or a connection by which entities are "operably connected," is one in which signals, physical communications, or logical communications may be sent or received. Typically, an operable connection includes a physical interface, an electrical interface, or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical or physical communication channels can be used to create an operable connection.

"Passband," as used herein, refers to the range of frequencies between the upper and lower cutoff frequencies of a communication channel or signal spectrum.

"Signal," as used herein, includes but is not limited to one or more electrical or optical signals, analog or digital signals, data, one or more computer or processor instructions, messages, a bit or bit stream, or other means that can be received, transmitted, or detected.

"Software," as used herein, includes but is not limited to, one or more computer or processor instructions that can be read, interpreted, compiled, or executed and that cause a computer, processor, or other electronic device to perform functions, actions or behave in a desired manner. The instructions may be embodied in various forms like routines, algorithms, modules, methods, threads, or programs including separate applications or code from dynamically or statically linked libraries. Software may also be implemented in a variety of executable or loadable forms including, but not limited to, a stand-alone program, a function call (local or remote), a servelet, an applet, instructions stored in a memory, part of an operating system or other types of executable instructions. It will be appreciated by one of ordinary skill in the art that the form of software may depend, for example, on requirements of a desired application, the environment in which it runs, or the desires of a designer/programmer or the like. It will also be appreciated that computer-readable or executable instructions can be located in one logic or distributed between two or more communicating, co-operating, or parallel processing logics and thus can be loaded or executed in serial, parallel, massively parallel and other manners.

Suitable software for implementing the various components of the example systems and methods described herein may be produced using programming languages and tools like Java, Pascal, C#, C++, C, CGI, Perl, SQL, APIs, SDKs, assembly, firmware, microcode, or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a web server to a user. In another example, the computer-readable medium has a form of the software/firmware as it is maintained on the web server. Other forms may also be used.

"User," as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

DETAILED DESCRIPTION

While the disclosed systems and methods are of particular interest to digital surround sound applications, the systems and methods are applicable to digital or analog audio systems and methods of any type. For purposes of this disclosure, the AC-3 system as described in the Digital Audio Compression Standard (AC-3) document A52/A of the Advanced Television Systems Committee (ATSC) and metadata as described in SMPTE RDD 6 will be used as examples. However, the disclosed invention is applicable to any coding system (e.g., AC-3, DTS, MPEG-2, AAC, HE AAC, and so on) that supports auxiliary data. The disclosed invention is also applicable to non-encoded systems. The disclosed invention may be implemented in encoded or non-encoded systems, in the analog or digital domain, in hardware or software, in real-time or non-real time.

Modern surround sound systems typically include at least six audio channels: Left Front, Right Front, Center, Left Surround, Right Surround, and Low Frequency Effect (LFE) (a.k.a. subwoofer). Five of these audio channels, Left Front, Right Front, Center, Left Surround, and Right Surround, typically use substantially the full audio passband (e.g., 20 Hz to 20 kHz). The sixth channel, the bandwidth limited LFE, typically uses no more than the lower 150 Hz of bandwidth, leaving the frequency range from 151 Hz to 20 kHz unused.

This frequency range may be used to carry associated or non associated auxiliary data. The auxiliary data may be audio or video metadata describing that particular program or any other kind of auxiliary data.

FIG. 1 illustrates an example spectrum 100 of an LFE audio channel conducting an exemplary LFE audio signal 110 prior to encoding. A portion 120 of the available bandwidth 130 in the LFE audio channel spectrum 100 is unused.

Figure 2:
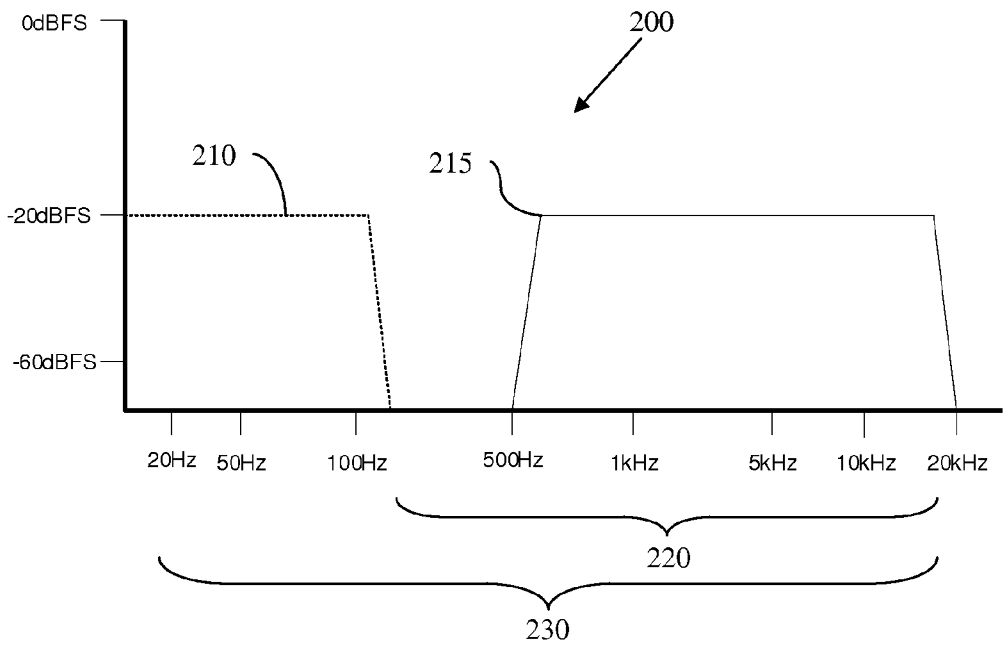
FIG. 2 illustrates a spectrum of the same LFE audio channel conducting the exemplary LFE audio signal and an exemplary modulated auxiliary data signal inserted on a previously unused spectrum portion.

FIG. 2 illustrates an example spectrum 200 of the same LFE audio channel conducting an exemplary LFE audio signal 210 and a modulated auxiliary data signal 215 that has been inserted on to the previously unused spectrum portion 220 of the audio channel's bandwidth 230.

In the illustrated embodiment, the audio signal 210 is illustrated as an LFE audio signal having a passband on the lower end of the audio channel's passband. In other embodiments (not shown), the audio signal may have a passband other than on the lower end of the audio channel's passband, or the audio signal may have noncontiguous or multiple passbands. In one embodiment where the modulated auxiliary data signal has a passband within the audio channel's passband, but outside of the audio signal's passband (i.e., the modulated auxiliary data signal has a bandwidth narrower than the difference between the audio channel's bandwidth minus the audio signal's bandwidth), the metadata and audio information may be extracted from the combined signal without loss of data.

Figure 3:
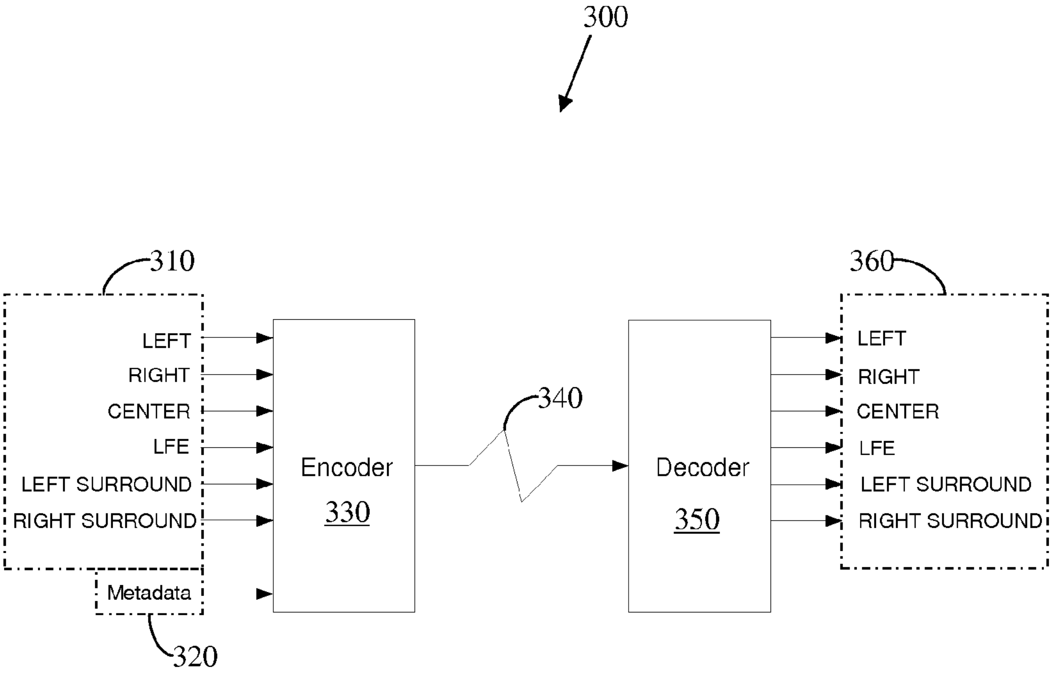
FIG. 3 illustrates a block diagram of an exemplary audio coding system.

FIG. 3 illustrates a block diagram of an exemplary audio coding system 300. Six input pulse-code modulation (PCM) audio channels 310 along with metadata 320 are input to an encoder 330. The encoder 330 processes the audio channels 310 and the metadata 320 and allocates a certain number of bits to represent the audio according to a predetermined protocol. Optimally, the encoder will allocate as few bits as necessary for a given audio quality. The encoder 330 outputs a bitstream 340. The bitstream 340 is delivered via a medium (e.g., broadcast, DVD, Internet, computer file, and so on) to a decoder 350 which converts the bitstream 340 to output PCM audio channels 360 to which the metadata information has been applied.

Figure 4:
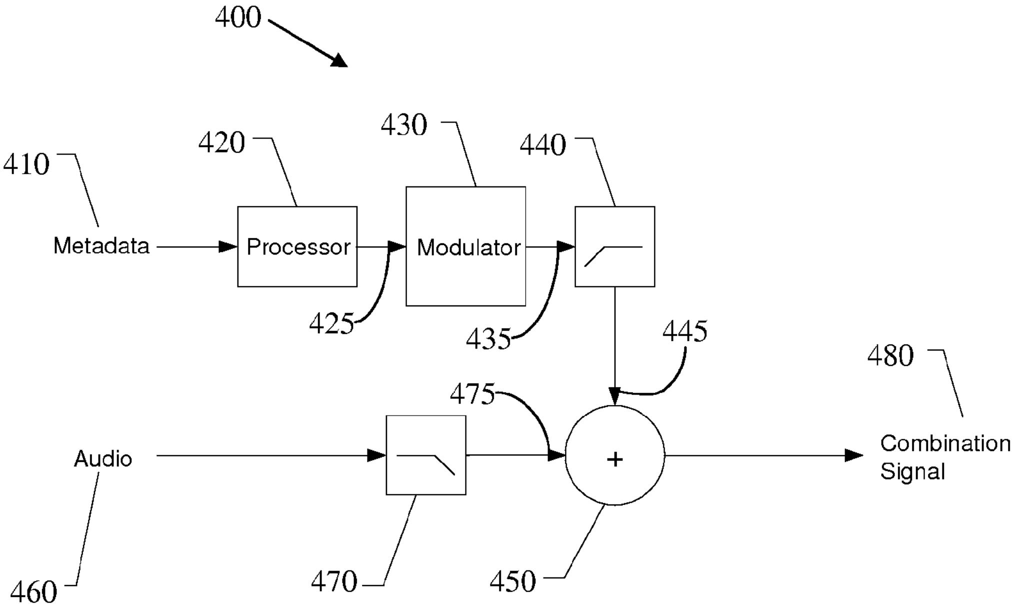
FIG. 4 illustrates a block diagram of an exemplary system for inserting auxiliary data into an audio channel that also contains audio information.

FIG. 4 illustrates a block diagram of an exemplary system 400 for inserting auxiliary data (e.g., metadata signal 410) into an audio channel that also contains audio information. System 400 may be part of a machine (not shown).

In one embodiment, the system 400 includes a processor 420. The processor 420 receives the metadata signal 410 where it is processed to add or remove data to correct errors or to eliminate redundancies. A modulator 430 receives the processor output signal 425. In an alternative embodiment, the system does not include a processor, and the modulator 430 receives the metadata signal 410 directly without the metadata signal 410 being processed.

The modulator 430 modulates the metadata signal 410 or the processor output signal 425 and outputs a modulated metadata signal 435 which has a passband within the audio passband. The modulator 430 may be one or a combination of modulation schemes and methods known in the art (e.g., Bi-phase Mark modulators, Frequency Shift Keying (FSK) modulators, a Phase Shift Keying (PSK) modulators, and so on). The exact modulation scheme to be used in an implementation may be selected according to the capability of the audio channel and the data conversion rates necessary.

In the illustrated embodiment, the system 400 includes a filter 440 that receives the modulated metadata signal 435 and attenuates frequencies outside of the passband of the modulated metadata signal 435. In one embodiment, where the audio channel is a low frequency effect (LFE) channel, the filter 440 is a high-pass filter that attenuates frequencies below the lower cutoff frequency of the modulated metadata signal 435. The output 445 of the filter 440 is applied to summing means 450. In other embodiments, the modulated metadata signal 435 is not applied to a filter and is applied directly to the summing means 450.

In the illustrated embodiment, an audio signal 460 is first applied to a filter 470 to remove any out of passband information. In the LFE example embodiment, the filter 470 is a low-pass filter that receives the audio signal 460 and attenuates frequencies above the upper cutoff frequency of the audio signal 460. The output 475 of the filter 470 is also applied to the summing means 450. In other embodiments, the audio signal 460 is not applied to a filter and is applied directly to the summing means 450.

The summing means 450 combines the modulated metadata signal 435 and the audio signal 460, or their filtered equivalents, 445 and 475 respectively. The summing means 450 may be one or a combination of schemes and methods known in the art (e.g., microprocessors, digital signal processors (DSP), summing amplifiers, mixers, multiplexers, modulators, and so on). The output of the summing means 450 is a combination signal 480 that includes metadata and audio information. In the LFE channel example, the combination signal 480 includes the metadata in addition to the LFE audio information.

The combination signal 480 is within the audio spectrum and can thus be inserted into a pre-existing audio channels including, but not limited to, an audio channel carrying LFE information.

In one embodiment (not shown), where the system 400 is implemented as part of a system having multiple audio channels as described above, the system 400 includes a delay logic that inserts compensating delays in the other audio channels to maintain absolute phase across all the audio channels.

Figure 5:
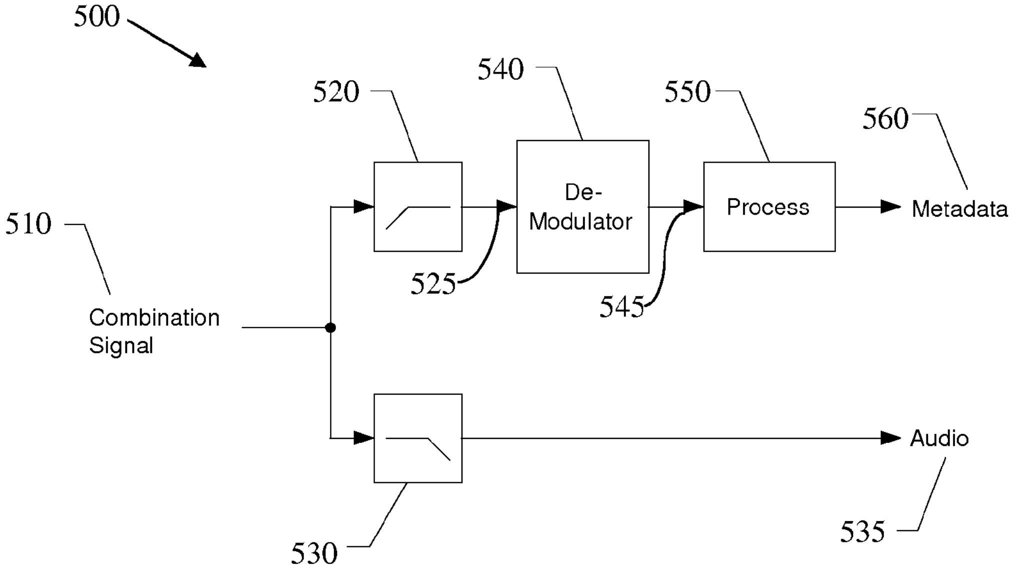
FIG. 5 illustrates a block diagram of an exemplary system for extracting auxiliary data from an audio channel that also contains audio information.

FIG. 5 illustrates a block diagram of an exemplary system 500 for extracting auxiliary data from an audio channel also containing audio information. System 500 may be part of a machine (not shown).

System 500 receives a combination signal 510 combining an audio signal and a modulated auxiliary data (e.g., metadata) signal. The system 500 includes at least two filters including a first filter 520 and a second filter 530 that receive the combination signal 510. The first filter 520 attenuates frequencies outside the passband of the modulated auxiliary data signal 525. The second filter 530 attenuates frequencies outside the passband of the audio signal 535. In one embodiment, where the audio channel is an LFE channel, the first filter 520 is a high-pass filter that attenuates frequencies below the lower cutoff frequency of the modulated auxiliary data signal 525 and the second filter 530 is a low-pass filter that attenuates frequencies above the upper cutoff frequency of the audio signal 535. The audio signal 535 is the LFE audio signal.

The system 500 further includes a demodulator 540 that receives the modulated auxiliary data signal 525 and demodulates it to convert it into an auxiliary data signal 545 encoding the auxiliary data. The demodulator 540 may be one or a combination of demodulation schemes and methods known in the art (e.g., Bi-phase Mark modulators, Frequency Shift Keying (FSK) modulators, a Phase Shift Keying (PSK) modulators, and so on). The exact demodulation scheme to be used in an implementation is dictated by the modulation scheme used.

In the illustrated embodiment, the system 500 includes a processor 550 that processes the auxiliary data signal 545 for error correction, reformatting of the auxiliary data signal per a particular standard (e.g., SMPTE RDD 6, and so on), redundancy reduction, decompression, and so on. The processor 550 outputs a metadata signal 560 encoding the auxiliary data. In another embodiment, the processor 550 may process the modulated auxiliary data signal 525 before it is applied to the demodulator 540. In other embodiments, the system 500 may not include processor 550.

In one embodiment (not shown), where the system 500 is implemented as part of a system having multiple audio channels as described above, the system 500 includes a delay logic that inserts compensating delays in the other audio channels to maintain absolute phase across all the audio channels.

The disclosed invention may also be implemented in audio channels that do not contain any audio data. These channels may be extra channels on a professional video tape recorder (VTR) or video server, or may be channels that would carry surround information in surround mode, but are otherwise silent during stereo programming mode or other modes of operation to preserve channel layout (e.g., per SMPTE 320M, and so on).

Figure 6:
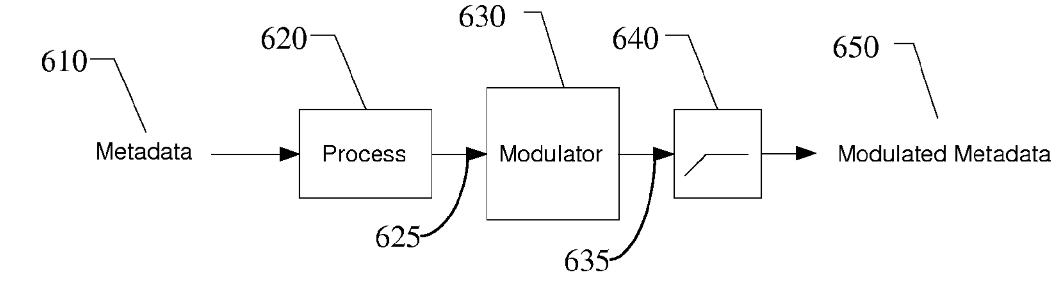
FIG. 6 illustrates a block diagram of an exemplary system for inserting auxiliary data into an audio channel that does not contain other audio information.

FIG. 6 illustrates a block diagram of an exemplary system 600 for inserting auxiliary data (e.g., metadata signal 610) into an audio channel that does not contain other audio information. System 600 may be part of a machine (not shown).

In the illustrated embodiment, the system 600 includes a processor 620. The processor 620 receives the metadata signal 610 and processes it to add or remove data to correct errors or to eliminate redundancies. A modulator 630 receives the processor output signal 625. In other embodiments, the modulator 630 receives the metadata signal 610 directly without the metadata signal 610 being processed by the processor 620, and thus the system 600 may not include processor 620.

The modulator 630 modulates the metadata signal 610 or the processor output signal 625 and outputs a modulated metadata signal 635 which has a passband within the audio passband. The modulator 630 may be one or a combination of modulation schemes and methods known in the art (e.g., Bi-phase Mark modulators, Frequency Shift Keying (FSK) modulators, a Phase Shift Keying (PSK) modulators, and so on). The exact modulation scheme to be used in an implementation may be selected according to the capability of the audio channel and the data conversion rates necessary.

In the illustrated embodiment, the system 600 includes a filter 640 that receives the modulated metadata signal 635 and attenuates frequencies outside of the passband of the modulated metadata signal 635. In one embodiment, the filter 640 is a high-pass filter that attenuates frequencies below the lower cutoff frequency of the modulated metadata signal 635. In other embodiments, the modulated metadata signal 635 is not applied to the filter 640.

The modulated metadata signal 650 is within the audio spectrum and can thus be inserted into a pre-existing audio channels including, but not limited to, an audio channel carrying LFE information.

In one embodiment (not shown), where the system 600 is implemented as part of a system having multiple audio channels as described above, the system 600 includes a delay logic that inserts compensating delays in the other audio channels to maintain absolute phase across all the audio channels.

Figure 7:
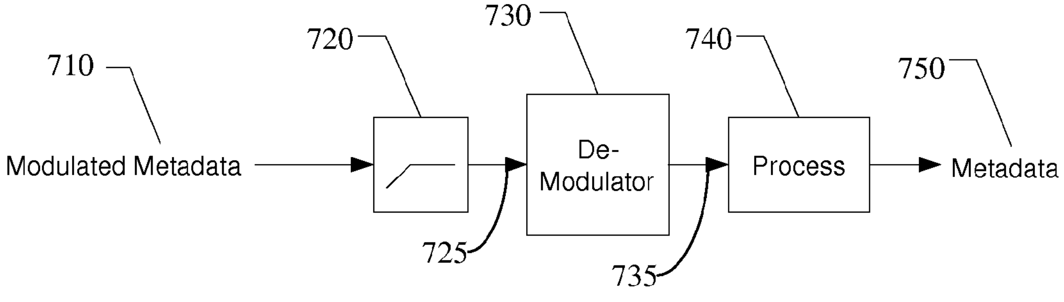
FIG. 7 illustrates a block diagram of an exemplary system for extracting auxiliary data from an audio channel that does not contain other audio information.

FIG. 7 illustrates a block diagram of an exemplary system 700 for extracting auxiliary data from an audio channel that does not contain other audio information. System 700 receives a modulated metadata signal 710 that has a passband within the audio passband. System 700 may be part of a machine (not shown).

In the illustrated embodiment, the system 700 includes a filter 720 that receives the modulated metadata signal 710. The filter 720 attenuates frequencies outside the passband of the modulated metadata signal 710 and outputs the modulated metadata signal 725. In one embodiment, the filter 720 is a high-pass filter that attenuates frequencies below the lower cutoff frequency of the modulated auxiliary data signal 710. In other embodiments, the system 700 does not include the filter 720.

The system 700 includes a demodulator 730 that receives the modulated metadata signal 725 and demodulates it to convert it into a metadata signal 735 encoding the auxiliary data.

In the illustrated embodiment, the system 700 includes a processor 740 that processes the metadata signal 735 for error correction, reformatting of the metadata signal per a particular standard (e.g., SMPTE RDD 6, and so on), redundancy reduction, decompression, and so on. In another embodiment, the processor 740 may process the modulated metadata signal 710 or the modulated metadata signal 725 before they are applied to the demodulator 730. In other embodiments, the system 700 may not include the processor 740. The output of the system 700 is the metadata signal 750 encoding the metadata.

In one embodiment (not shown), where the system 700 is implemented as part of a system having multiple audio channels as described above, the system 700 includes a delay logic that inserts compensating delays in the other audio channels to maintain absolute phase across all the audio channels.

Example methods may be better appreciated with reference to the flow diagrams of FIGS. 8, 9, 10 and 11. While for purposes of simplicity of explanation, the illustrated methodologies are shown and described as a series of blocks, it is to be appreciated that the methodologies are not limited by the order of the blocks, as some blocks can occur in different orders or concurrently with other blocks from that shown and described. Moreover, less than all the illustrated blocks may be required to implement an example methodology. Furthermore, additional methodologies, alternative methodologies, or both can employ additional blocks, not illustrated.

In the flow diagrams, blocks denote "processing blocks" that may be implemented with logic. The processing blocks may represent a method step or an apparatus element for performing the method step. The flow diagrams do not depict syntax for any particular programming language, methodology, or style (e.g., procedural, object-oriented). Rather, the flow diagrams illustrate functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown or that blocks may be combined or separated into multiple components. It will be appreciated that the processes may be implemented using various programming approaches like machine language, procedural, object oriented or artificial intelligence techniques.

Figure 8:
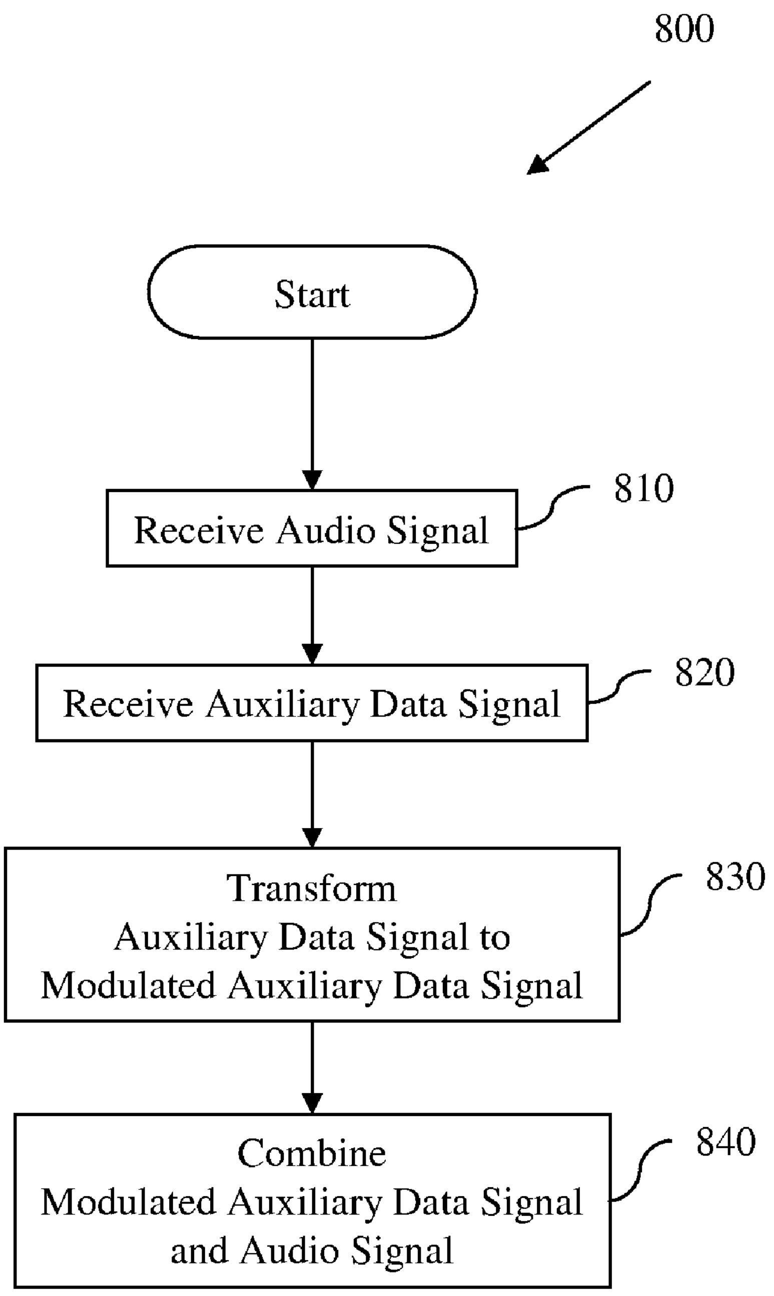
FIG. 8 illustrates a flow diagram for an example method of inserting metadata to be carried within audio signals.

FIG. 8 illustrates a flow diagram for an example method 800 of inserting metadata to be carried within audio signals. At 810, the method 800 receives an audio signal. At 820, the method 800 receives an auxiliary data signal.

At 830, the method 800 transforms the auxiliary data signal into a modulated auxiliary data signal that has a passband within the audio passband and that does not overlap the audio signal's passband. Transformation methods may include one or a combination of modulation schemes and methods known in the art (e.g., Bi-phase Mark, Frequency Shift Keying (FSK), Phase Shift Keying (PSK), and so on). The exact modulation scheme to be used is at least in part dictated by the capability of the audio channel and the data conversion rates.

In one embodiment (not shown), the auxiliary data signal is processed to correct errors or to reduce redundancies before being transformed into the modulated auxiliary data signal. In another embodiment (not shown), the modulated auxiliary data signal is processed to correct errors or to reduce redundancies.

In one embodiment (not shown), the modulated auxiliary data signal is filtered to attenuate frequencies outside of the modulated auxiliary data signal's passband. In one embodiment, where the audio signal corresponds to an LFE channel, the modulated auxiliary data signal is high-pass filtered to attenuate frequencies below the modulated auxiliary data signal's lower cutoff frequency, and the audio signal is low-pass filtered to attenuate frequencies above the audio signal's upper cutoff frequency.

At 840, the method 800 combines the modulated auxiliary data signal and the audio signal to form a combination signal incorporating the auxiliary data and audio information. In some embodiments, combining the modulated auxiliary data signal and the audio signal may include either modulating the audio signal to encode the modulated auxiliary data signal onto the audio signal, or modulating the modulated auxiliary data signal to encode the audio signal onto the modulated auxiliary data signal. In other embodiments, combining the modulated auxiliary data signal and the audio signal may include summing, mixing, or multiplexing of the modulated auxiliary data signal and the audio signal.

In one embodiment (not shown), where the method 800 is practiced in a configuration including multiple audio channels, time delays are inserted in the other audio channels to maintain absolute phase across all the audio channels.

Figure 9:
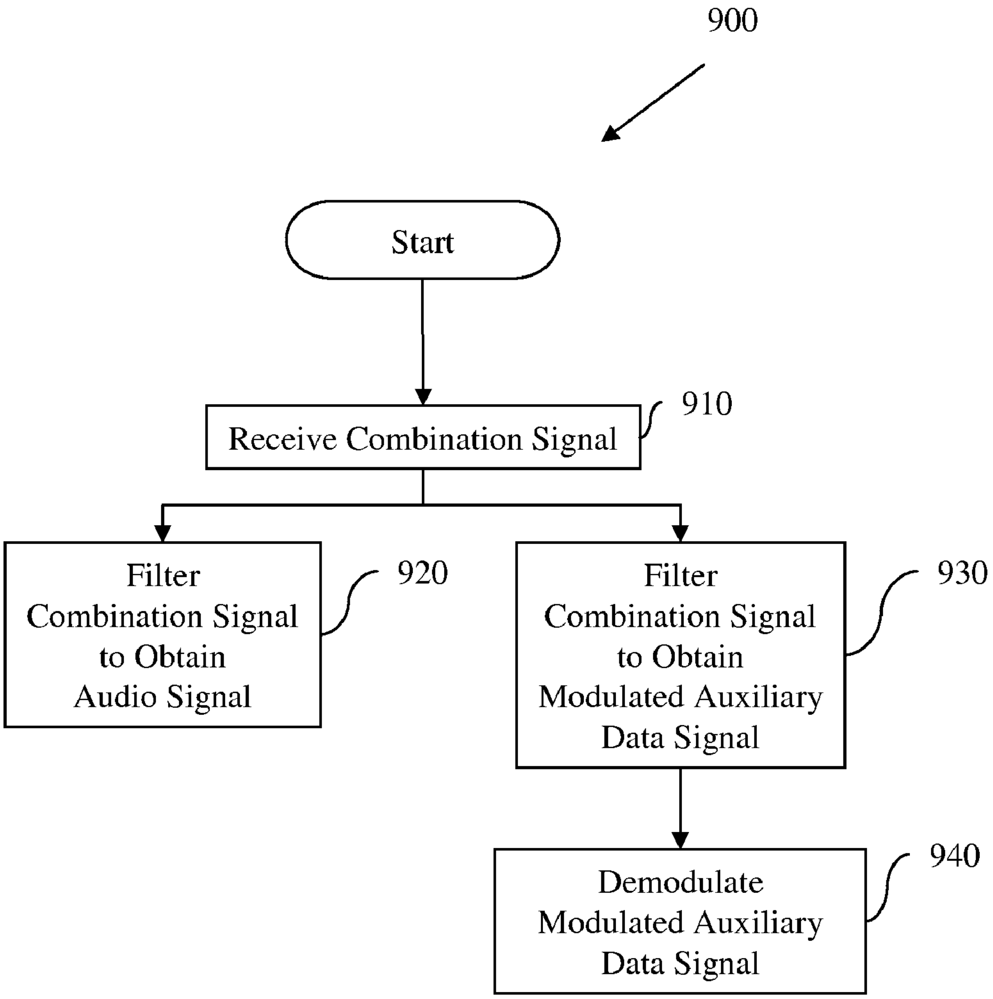
FIG. 9 illustrates a flow diagram for an example method of extracting auxiliary data carried within an audio signal.

FIG. 9 illustrates a flow diagram for an example method 900 of extracting auxiliary data carried within an audio signal. At 910, the method 900 receives a combination signal including an audio signal and a modulated auxiliary data signal. The modulated auxiliary data signal has a passband within the audio passband and not overlapping the audio signal's passband.

At 920, the method 900 filters the combination signal to attenuate frequencies outside the audio signal's passband. In one embodiment, where the audio channel is an LFE channel, the combination signal is low-pass filtered to attenuate frequencies above the upper cutoff frequency of the audio signal. The output of step 920 is the original audio signal.

At 930, the method 900 filters the combination signal to attenuate frequencies outside the passband of the modulated auxiliary data signal. In one embodiment, where the audio channel is an LFE channel, the combination signal is high-pass filtered to attenuate frequencies below the lower cutoff frequency of the modulated auxiliary data signal. The output of step 930 is the modulated auxiliary data signal.

At 940, the method 900 demodulates the modulated auxiliary data signal transforming it into the auxiliary data signal. Demodulation methods may include one or more demodulation schemes and methods known in the art (e.g., Bi-phase Mark, Frequency Shift Keying (FSK), Phase Shift Keying (PSK), and so on). The exact demodulation scheme to be used in an implementation is dictated by the modulation scheme used to modulate the modulated auxiliary data signal.

In one embodiment (not shown), the modulated auxiliary data signal is processed to correct errors or to reduce redundancies before being demodulated. In another embodiment (not shown), the (demodulated) auxiliary data signal is processed to correct errors or to reduce redundancies.

In one embodiment (not shown), where the method 900 is practiced in a configuration including multiple audio channels, time delays are inserted in the other audio channels to maintain absolute phase across all the audio channels.

Figure 10:
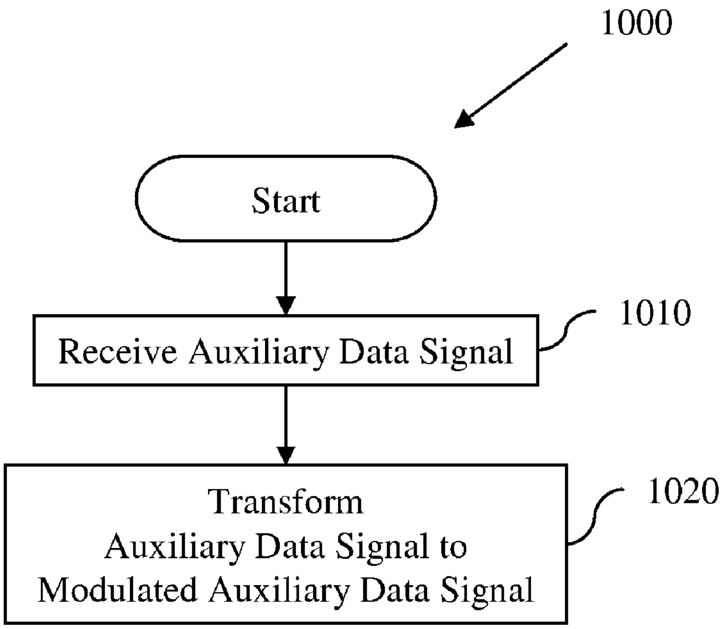
FIG. 10 illustrates a flow diagram for an example method of inserting metadata to be carried on an audio channel that does not contain other audio information.

FIG. 10 illustrates a flow diagram for an example method 1000 of inserting metadata to be carried on an audio channel that does not contain other audio information. At 1010, the method 1000 receives an auxiliary data signal.

At 1020, the method 1000 transforms the auxiliary data signal into a modulated auxiliary data signal that has a passband within the audio passband. The modulated auxiliary data signal may be inserted into a pre-existing, unused audio channel.

Modulation methods may include one or a combination of modulation schemes and methods known in the art (e.g., Bi-phase Mark, Frequency Shift Keying (FSK), Phase Shift Keying (PSK), and so on). The exact modulation scheme to be used is at least in part dictated by the capability of the audio channel and the data conversion rates.

In one embodiment (not shown), the auxiliary data signal is processed to correct errors or to reduce redundancies before being transformed into the modulated auxiliary data signal. In another embodiment (not shown), the modulated auxiliary data signal is processed to correct errors or to reduce redundancies.

In one embodiment (not shown), the modulated auxiliary data signal is filtered to attenuate frequencies outside of the modulated auxiliary data signal's passband. In one embodiment, where the audio signal corresponds to an LFE channel, the modulated auxiliary data signal is high-pass filtered to attenuate frequencies below the modulated auxiliary data signal's lower cutoff frequency.

In one embodiment (not shown), where the method 1000 is practiced in a configuration including multiple audio channels, time delays are inserted in the other audio channels to maintain absolute phase across all the audio channels.

Figure 11:
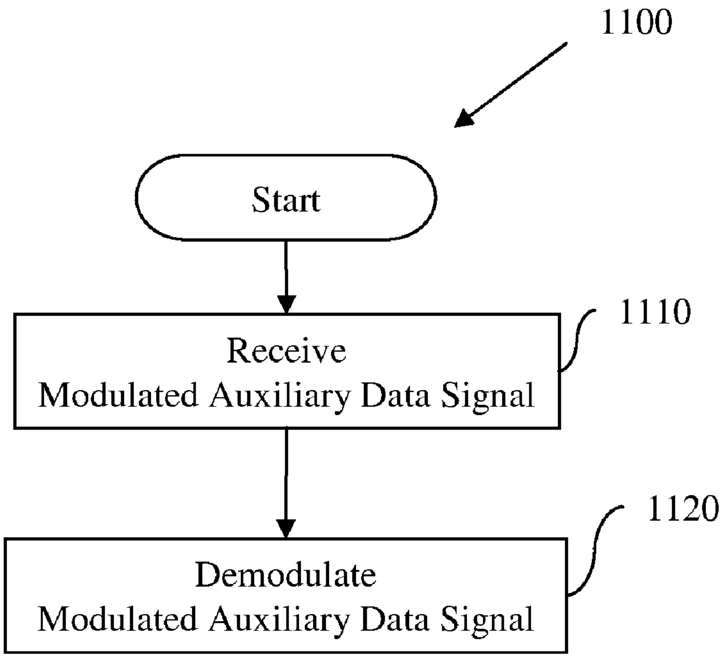
FIG. 11 illustrates a flow diagram for an example method of extracting auxiliary data carried from an audio channel that does not contain other audio information.

FIG. 11 illustrates a flow diagram for an example method 1100 of extracting auxiliary data carried from an audio channel that does not contain other audio information. At 1110, the method 1100 receives a modulated auxiliary data signal. The modulated auxiliary data signal has a passband within the audio passband.

In one embodiment (not shown), the modulated auxiliary data signal is filtered to attenuate frequencies outside the modulated auxiliary data signal's passband. In one embodiment (not shown), the modulated auxiliary data signal is high-pass filtered to attenuate frequencies below the lower cutoff frequency of the modulated auxiliary data signal.

At 1120, the method 1100 demodulates the modulated auxiliary data signal transforming it into the auxiliary data signal. Demodulation methods may include one or more demodulation schemes and methods known in the art (e.g., Bi-phase Mark, Frequency Shift Keying (FSK), Phase Shift Keying (PSK), and so on). The exact demodulation scheme to be used in an implementation is dictated by the modulation scheme used to modulate the modulated auxiliary data signal.

In one embodiment (not shown), the modulated auxiliary data signal is processed to correct errors or to reduce redundancies before being demodulated. In another embodiment (not shown), the (demodulated) auxiliary data signal is processed to correct errors or to reduce redundancies.

In one embodiment (not shown), where the method 1100 is practiced in a configuration including multiple audio channels, time delays are inserted in the other audio channels to maintain absolute phase across all the audio channels.

The auxiliary data signal encodes auxiliary data such as audio or video metadata that may be used to describe the audio or video program.

While FIGS. 8, 9, 10 and 11 illustrate various actions occurring in serial, it is to be appreciated that various actions illustrated could occur substantially in parallel, and while actions may be shown occurring in parallel, it is to be appreciated that these actions could occur substantially in series. While a number of processes are described in relation to the illustrated methods, it is to be appreciated that a greater or lesser number of processes could be employed and that lightweight processes, regular processes, threads, and other approaches could be employed. It is to be appreciated that other example methods may, in some cases, also include actions that occur substantially in parallel. The illustrated exemplary methods and other embodiments may operate in real-time, faster than real-time in a software or hardware or hybrid software/hardware implementation, or slower than real time in a software or hardware or hybrid software/hardware implementation.

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A machine comprising:

a surround sound system including at least six audio signals corresponding to a Left Front, a Right Front, a Center, a Left Surround, a Right Surround, and a Low Frequency Effect (LFE), and configured to insert auxiliary data into a combination audio signal including data from the LFE audio signal without loss of data from the LFE audio signal, the system including:

a modulator configured to convert an auxiliary data signal received by the surround sound system into a modulated auxiliary data signal having a passband within the audio passband and within the passband of at least one of the Left Front, the Right Front, the Center, the Left Surround, or the Right Surround audio signals of the surround sound system, but outside the passband of the LFE audio signal as received by the surround sound system; and summing means configured to combine the modulated auxiliary data signal and the LFE audio signal into the combination signal without loss of data from the LFE audio signal as received by the surround sound system.

2. The machine of claim 1, further comprising:

a processor configured to process at least one of the auxiliary data signal and the modulated auxiliary data signal for at least one of error correction, redundancy reduction, and compression.

3. The machine of claim 1, the system further including:

a low-pass filter configured to receive the LFE audio signal prior to the summing means combining the LFE audio signal with the modulated auxiliary data signal, and further configured to attenuate frequencies above the LFE audio signal's upper cutoff frequency without loss of data to the LFE audio signal as received by the surround sound system.

4. The machine of claim 1, the system further including:

a delay logic configured to insert a compensating delay in at least one of the Left Front, the Right Front, the Center, the Left Surround, and the Right Surround.

5. The machine of claim 1, where the modulator is one of a Bi-phase Mark modulator, a Frequency Shift Keying (FSK) modulator, and a Phase Shift Keying (PSK) modulator.

6. The machine of claim 1, wherein at least a portion of the modulated auxiliary data signal is in the range from 500 Hz to 10 kHz.

7. A machine comprising:

a surround sound system including at least six audio signals corresponding to a Left Front, a Right Front, a Center, a Left Surround, a Right Surround, and a Low Frequency Effect (LFE), and configured to extract auxiliary data from a combination audio signal including the LFE audio signal without loss of data from the LFE audio signal, the system including:

a first filter configured to receive the combination signal including the LFE audio signal and a modulated auxiliary data signal, where the modulated auxiliary data signal has a passband within the audio passband and within the passband of at least one of the Left Front, the Right Front, the Center, the Left Surround, or the Right Surround audio signals of the surround sound system and outside the passband of the LFE audio signal, and where the first filter is further configured to attenuate frequencies outside the modulated auxiliary data signal's passband to substantially obtain the modulated auxiliary data signal;

a demodulator configured to convert the modulated auxiliary data signal into an auxiliary data signal encoding the auxiliary data; and a second filter configured to receive the combination signal including the LFE audio signal and a modulated auxiliary data signal and further configured to attenuate frequencies above the upper cutoff frequency of the LFE audio signal to substantially obtain the LFE audio signal.

8. The machine of claim 7, further comprising:

a processor configured to process at least one of the auxiliary data signal and the modulated auxiliary data signal for at least one of error correction, redundancy reduction, and decompression.

9. The machine of claim 7, the system further including:

a delay logic configured to insert compensating delay in at least one of the Left Front, the Right Front, the Center, the Left Surround, or the Right Surround.

10. The machine of claim 7, wherein at least a portion of the modulated auxiliary data signal is in the range from 500 Hz to 10 kHz.

11. A method comprising:

inserting metadata to be carried within a Low Frequency Effect (LFE) audio channel of a surround sound system including at least six audio signals corresponding to a Left Front, a Right Front, a Center, a Left Surround, a Right Surround, and a Low Frequency Effect (LFE) substantially without loss of data from the LFE audio signal as received by the surround sound system, the method inserting comprising:

receiving the LFE audio signal;

receiving a metadata signal including the metadata;

transforming the metadata signal into a modulated metadata signal having a passband within the audio passband and not overlapping the passband of the LFE audio signal as received by the surround sound system; and combining the modulated metadata signal and the LFE audio signal to form a combination signal incorporating the metadata signal and the LFE audio signal.

12. The method of claim 11, further comprising:

before combining the modulated metadata signal and the LFE audio signal to form the combination signal, filtering the modulated metadata signal to attenuate frequencies outside of the modulated metadata signal's passband.

13. The method of claim 11, the method further comprising, before combining the modulated metadata signal and the LFE audio signal to form the combination signal:

filtering the modulated metadata signal to attenuate frequencies below the modulated metadata signal's lower cutoff frequency; and filtering the LFE audio signal to attenuate frequencies above the LFE audio signal's upper cutoff frequency.

14. The method of claim 11, further comprising:

processing at least one of the metadata signal and the modulated metadata signal for at least one of error correction and redundancy reduction.

15. The method of claim 11, the method further comprising:

inserting compensating time delay in at least one of the Left Front, the Right Front, the Center, the Left Surround, or the Right Surround.

16. The method of claim 11, where the combining the modulated metadata signal and the LFE audio signal to form the combination signal includes one of modulating the LFE audio signal to encode the modulated metadata signal and modulating the modulated metadata signal to encode the LFE audio signal.

17. The method of claim 11, wherein at least a portion of the modulated metadata signal is in the range from 500 Hz to 10 kHz.

18. A method comprising:

extracting metadata carried within a Low Frequency Effect (LFE) audio channel of a surround sound system including at least six audio signals corresponding to a Left Front, a Right Front, a Center, a Left Surround, a Right Surround, and a Low Frequency Effect (LFE) substantially without loss of data from the LFE audio signal, the extracting comprising:

receiving a combination signal including the LFE audio signal and a modulated metadata signal encoding the metadata, where the modulated metadata signal has a passband within the audio passband and not overlapping the passband of the LFE audio signal;

filtering the combination signal to obtain the modulated metadata signal;

demodulating the modulated metadata signal; and filtering the combination signal to obtain the LFE audio signal.

19. The method of claim 18, the method further comprising:

processing at least one of the modulated metadata signal and the demodulated metadata signal to remove errors and redundant data; and inserting compensating time delay in at least one of the Left Front, the Right Front, the Center, the Left Surround, or the Right Surround.

20. The method of claim 18, wherein at least a portion of the modulated metadata signal is in the range from 500 Hz to 10 kHz.

* * * * *